US012704552B2

(12) United States Patent
Park

(10) Patent No.: US 12,704,552 B2
(45) Date of Patent: Aug. 11, 2026

(54) APPARATUS FOR INDICATING BATTERY STATE AND METHOD OF CONTROLLING THE SAME

(71) Applicant: SAMSUNG SDI CO., LTD., Yongin-si (KR)

(72) Inventor: Jong Sam Park, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 176 days.

(21) Appl. No.: 18/429,279

(22) Filed: Jan. 31, 2024

(65) Prior Publication Data

US 2025/0116709 A1 Apr. 10, 2025

(30) Foreign Application Priority Data

Oct. 6, 2023 (KR) ........................ 10-2023-0133093

(51) Int. Cl.
*G01R 31/371* (2019.01)
*H02J 7/80* (2026.01)

(52) U.S. Cl.
CPC .............. *G01R 31/371* (2019.01); *H02J 7/80* (2026.01)

(58) Field of Classification Search
CPC .. G01R 31/371; G06F 1/3203; H02J 2207/10; H02J 7/0047; H02J 7/0063; Y02E 60/10
See application file for complete search history.

(56) References Cited

U.S. PATENT DOCUMENTS 5,477,123 A * 12/1995 Allen .................. H01M 10/441 320/124
8,380,999 B1 * 2/2013 Robison ........... H04W 52/0261 320/120
8,742,727 B2 * 6/2014 Joe ........................ H01M 4/362 324/426
8,937,459 B2 * 1/2015 Park ......................... H02J 7/00 320/152
9,166,419 B2 * 10/2015 Girard ................. H01M 10/441
2015/0134990 A1 5/2015 Masuda et al.
2019/0018739 A1 * 1/2019 Hashimoto ......... G06F 11/1466

FOREIGN PATENT DOCUMENTS

CN 218824704 U * 4/2023

OTHER PUBLICATIONS

Extended European Search Report issued in corresponding EP Application No. 24170239.8, dated Dec. 16, 2024, 8 pages.

* cited by examiner

*Primary Examiner* — Vinh P Nguyen

(74) *Attorney, Agent, or Firm* — Womble Bond Dickinson (US) LLP

(57) ABSTRACT

An apparatus for indicating a battery state includes a battery module configured to supply power to an electronic appliance; a switch module configured to receive user manipulation input for terminating operation of the electronic appliance; and a processor being configured to receive user manipulation input for terminating operation of the electronic appliance through the switch module, to determine whether a current operation of the electronic appliance is to be continued, and, in response to receiving the user manipulation input and determining that the current operation of the electronic appliance is to be continued, to turn off a state indication module indicating a state of a battery and to maintain discharge from the battery module until current operation of the electronic appliance is finished.

8 Claims, 4 Drawing Sheets

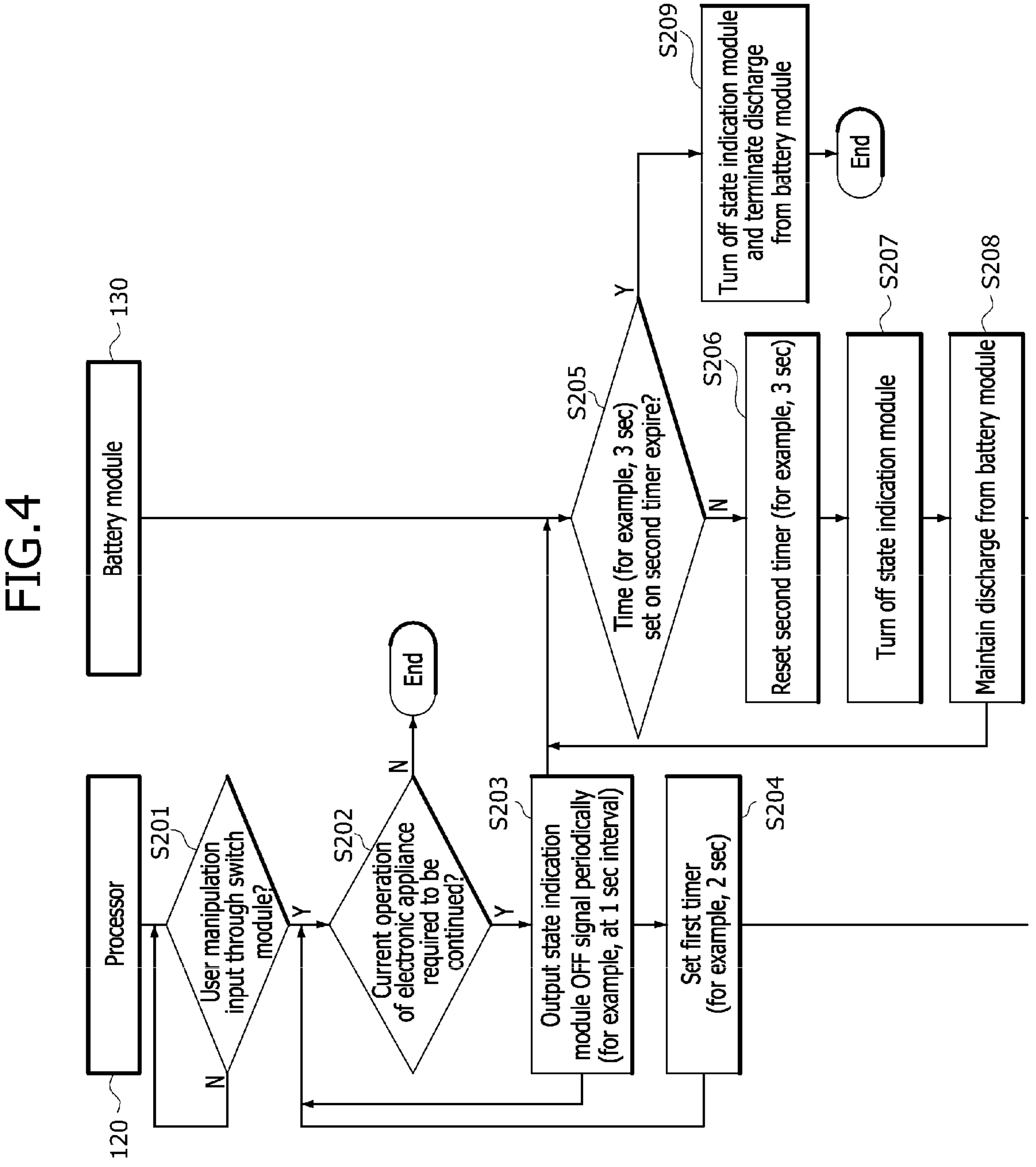
FIG.4
Processor
120
Battery module
130
S201
User manipulation input through switch module?
S202
Current operation of electronic appliance required to be continued?
End
S203
Output state indication module OFF signal periodically (for example, at 1 sec interval)
S204
Set first timer (for example, 2 sec)
S205
Time (for example, 3 sec) set on second timer expire?
S206
Reset second timer (for example, 3 sec)
S207
Turn off state indication module
S208
Maintain discharge from battery module
S209
Turn off state indication module and terminate discharge from battery module
End
Y
N

APPARATUS FOR INDICATING BATTERY STATE AND METHOD OF CONTROLLING THE SAME

CROSS-REFERENCE TO RELATED APPLICATION

The present application claims priority to and the benefit of Korean Patent Application No. 10-2023-0133093, filed on Oct. 6, 2023, in the Korean Intellectual Property Office, the entire disclosure of which is incorporated herein by reference.

BACKGROUND

1. Field

Aspects of the present invention relate to an apparatus for indicating a battery state and a method of controlling the same.

2. Description of the Related Art

Generally, an electronic appliance that runs on electricity (for example, AC power), such as a television, a fan, a computer, a photocopier, etc., includes a lighting device (for example, a lighting device using an LED) to indicate that the electronic appliance is in a standby state or the like.

Here, "standby state" refers to a state in which, after operation of the electricity-powered electronic appliance is terminated by turning a power switch off, the electronic appliance is supplied with standby power to be operated immediately upon turning the power switch on.

In recent years, there is an increasing number of electronic appliances that are powered by batteries (for example, a built-in battery module, a replaceable battery modules, etc.).

These electronic appliances include a state indication module (for example, a battery state indication module) to allow a user to intuitively know a state of a battery (for example, a built-in battery module, a replaceable battery module, etc.).

In an electronic appliance including such a state indication module for indicating a state of a battery (for example, the discharge state or charge state of the battery), when a user manipulates the electronic appliance to terminate operation thereof, the battery stops discharging (that is, stops supply of power for driving the electronic appliance) and, immediately thereafter, the state indication module (for example, a battery state indication module) is turned off. This may be unlike in a conventional electronic appliance supplied with normal electricity (for example, AC power) to indicate that the electronic appliance is in a standby state.

That is, discharge from the battery (that is, supply of power for driving the electronic appliance) is terminated as soon as operation of the electronic appliance is terminated, and, immediately thereafter, the state indication module (for example, a battery state indication module) is turned off to indicate the state of the battery.

However, depending on the type of electronic appliance, there can be a situation in which it is desirable for the current operation of the electronic appliance to be continued without being immediately terminated after a user manipulates the electronic appliance to terminate operation thereof (for example, a situation in which it is desirable for the electronic appliance to operate in background mode)

For example, when a user presses a power switch of a vacuum cleaner to turn off the vacuum cleaner while the vacuum cleaner transmits cleaning information to a user terminal with a vacuum cleaner set connected to a vacuum cleaner stand, it is desirable for the discharge from a battery (that is, supply of power for driving the electronic appliance) to be continued until transmission of the cleaning information is finished. Here, if discharge from the battery is continued and a state indication module (for example, a battery state indication module) implemented by a lighting element (for example, an LED) is not tuned off until the vacuum cleaner completes transmission of the cleaning information, a user can make an incorrect determination that the electronic appliance (or a battery module) has malfunctioned.

In such a situation, when a state indication module of an electronic appliance is implemented by a display device (for example, an LCD) to display information indicating a current state of the electronic appliance (for example, a state in which current operation of the electronic appliance is not completed and is required to be continued), a user may avoid making an incorrect determination that the electronic appliance (or a battery module) has malfunctioned even when encountering a situation in which the electronic appliance continues to operate after the user manipulates the electronic appliance to terminate operation thereof.

Conversely, when the state indication module (for example, a battery state indication module) is implemented simply by a lighting element (for example, an LED), a user can make an incorrect determination that the electronic appliance (or the battery module) has malfunctioned when encountering a situation in which the state indication module (for example, a battery state indication module) is not turned off (for example, the LED is not turned off) after the user manipulates the electronic appliance to terminate operation thereof.

Therefore, there is a need for a state indication module control method which, when applied to an electronic appliance equipped with a state indication module implemented simply by a lighting element (for example, an LED), can allow a user to avoid making an incorrect determination that the electronic appliance (or a battery module) has malfunctioned in a situation in which it is desired for the current operation of the electronic appliance to be continued without being immediately terminated after the user manipulates the electronic appliance to terminate operation thereof (for example, when there occurs a situation in which the electronic appliance is required to operate in background mode).

The above information disclosed in this Background section is only for enhancement of understanding of the background of the invention and therefore it may contain information that does not form the prior art.

SUMMARY

Aspects of some embodiments of the present invention are directed to an apparatus for indicating a battery state, which can indicate a state of a battery supplying power to an electronic appliance, and a method of controlling the same.

Aspect of some other embodiments of the present invention are directed to provide an apparatus for indicating a battery state, which, when applied to an electronic appliance equipped with a state indication module implemented simply by a lighting element (for example, an LED), can allow a user to avoid making an incorrect determination that the electronic product or a battery module has malfunctioned when there occurs a situation in which it is desirable for the current operation of the electronic appliance to be continued without being immediately terminated after the user manipulates the electronic product to terminate operation thereof. Some aspects are also directed to a method of controlling the same.

These and other aspects and features of the present invention will be described in or will be apparent from the following description of embodiments of the present invention.

According to some embodiments of the present invention, there is provided an apparatus for indicating a battery state, the apparatus comprising: a battery module configured to supply power to an electronic appliance; a switch module configured to receive user manipulation input for terminating operation of the electronic appliance; and a processor being configured to receive user manipulation input for terminating operation of the electronic appliance through the switch module, to determine whether a current operation of the electronic appliance is to be continued, and, in response to receiving the user manipulation input and determining that the current operation of the electronic appliance is to be continued, to turn off a state indication module indicating a state of a battery and to maintain discharge from the battery module until current operation of the electronic appliance is finished.

In some embodiments, in response to receiving the user manipulation input for terminating operation of the electronic appliance and determining that the current operation of the electronic appliance is already completed, the processor is configured to turn off the state indication module and terminate discharge from the battery module.

In some embodiments, the battery module comprises a built-in battery module and an external battery module that is replaceable by a user.

In some embodiments, the processor is configured to control switching of a relay circuit of the battery module to terminate or maintain discharge from the battery module.

In some embodiments, the battery module comprises: a control circuit configured to perform OFF control of the state indication module and discharge control from the battery module in response to a control signal transmitted from the processor, the control signal being a state indication module OFF signal.

In some embodiments, the control circuit of the battery module is configured to perform wired communication with the processor via designated terminals.

In some embodiments, the state indication module is configured to indicate the state of the battery using a light emitting diode (LED).

According to some embodiments of the present invention, there is provided an apparatus for indicating a battery state, the apparatus comprising: a battery module configured to supply power to an electronic appliance; a switch module configured to receive user manipulation input for terminating operation of the electronic appliance; and a processor being configured to receive user manipulation input for terminating operation of the electronic appliance through the switch module, to determine whether a current operation of the electronic appliance is to be continued, and, in response to receiving the user manipulation input and determining that the current operation of the electronic appliance is to be continued, to periodically output a state indication module OFF signal to the battery module until the current operation of the electronic appliance is finished, wherein the battery module comprises: a control circuit configured to reset a timer, to turn off the state indication module, and to maintain discharge from the battery module, in response to the battery module receiving the state indication module OFF signal before expiration of a time set on the timer.

In some embodiments, the control circuit of the battery module is further configured to turn off the state indication module and to terminate discharge from the battery module, in response to the battery module receiving the state indication module OFF signal after expiration of the time set on the timer.

According to some embodiments of the present invention, there is provided a method of indicating a battery state, the method comprising: receiving, by a processor of an apparatus for indicating a battery state, user manipulation input for terminating an electronic appliance through a switch module; determining, by the processor, that a current operation of the electronic appliance is to be continued; turning off, by the processor, a state indication module configured to indicate a state of a battery; and maintaining, by the processor, discharge from a battery module supplying power to the electronic appliance until current operation of the electronic appliance is finished.

In some embodiments, the method further comprises: determining, by the processor, that the current operation of the electronic appliance is already completed; and turning off, by the processor, the state indication module and terminating discharge from the battery module.

In some embodiments, in response to performing discharge control from the battery module, the processor is configured to control switching of a relay circuit of the battery module to terminate or maintain discharge from the battery module.

According to some embodiments of the present invention, there is provided a method of indicating a battery state, the method comprising: receiving, by a processor of an apparatus for indicating a battery state, user manipulation input for terminating an electronic appliance through a switch module; determining, by the processor, that a current operation of the electronic appliance is to be continued; periodically outputting, by the processor, a state indication module OFF signal as a predetermined control signal to a battery module of the apparatus until the current operation of the electronic appliance is finished, the battery module being configured to supply power to the electronic appliance; and in response to receiving, by the battery module, the state indication module OFF signal before expiration of a time set on a timer, resetting a timer, turning off the state indication module, and maintaining discharge from the battery module, by a control circuit of the battery module.

In some embodiments, the control circuit of the battery module is further configured to turn off the state indication module and to terminate discharge from the battery module, in response to the battery module receives the state indication module OFF signal after expiration of the time set on the timer.

The apparatus for indicating a battery state according to the present invention can indicate a state of a battery supplying power to an electronic appliance.

When applied to an electronic appliance equipped with a state indication module implemented simply by a lighting element (for example, an LED), the apparatus for indicating a battery state according to the present invention can allow a user to avoid making an incorrect determination that the electronic product or a battery module has malfunctioned when there occurs a situation in which it is desired that the current operation of the electronic appliance is to be continued without being immediately terminated after the user manipulates the electronic product to terminate operation thereof.

However, aspects and features of the present invention are not limited to those described above, and other aspects and features not mentioned will be clearly understood by a person skilled in the art from the detailed description given below.

BRIEF DESCRIPTION OF DRAWINGS

The following drawings attached to this specification illustrate embodiments of the present invention, and further describe aspects and features of the present invention together with the detailed description of the present invention. Thus, the present invention should not be construed as being limited to the drawings:

FIG. 4 is a flowchart illustrating a method of controlling an apparatus for indicating a battery state according to some other embodiments of the present invention.

DETAILED DESCRIPTION

Figure 1:
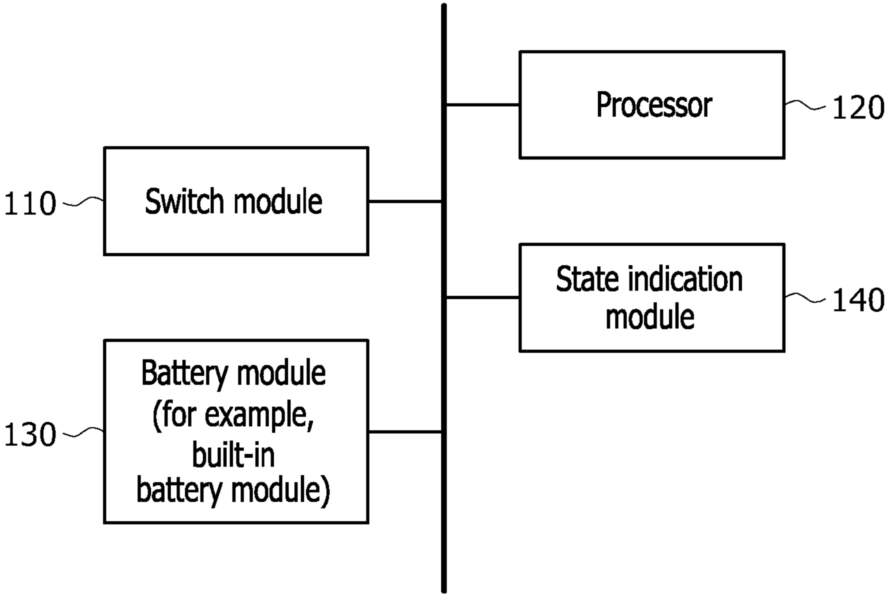
FIG. 1 is a schematic diagram of an apparatus for indicating a battery state according to some embodiments of the present invention.

Hereinafter, embodiments of the present disclosure will be described, in detail, with reference to the accompanying drawings. The terms or words used in this specification and claims should not be construed as being limited to the usual or dictionary meaning and should be interpreted as meaning and concept consistent with the technical idea of the present disclosure based on the principle that the inventor can be his/her own lexicographer to appropriately define the concept of the term to explain his/her invention.

The embodiments described in this specification and the configurations shown in the drawings are only some of the embodiments of the present disclosure and do not represent all of the technical ideas, aspects, and features of the present disclosure. Accordingly, it should be understood that there may be various equivalents and modifications that can replace or modify the embodiments described herein at the time of filing this application.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of" and "any one of," when preceding a list of elements, modify the entire list of elements and do not modify the individual elements of the list. When phrases such as "at least one of A, B and C, "at least one of A, B or C," "at least one selected from a group of A, B and C," or "at least one selected from among A, B and C" are used to designate a list of elements A, B and C, the phrase may refer to any and all suitable combinations or a subset of A, B and C, such as A, B, C, A and B, A and C, B and C, or A and B and C. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

References to two compared elements, features, etc. as being "the same" may mean that they are "substantially the same". Thus, the phrase "substantially the same" may include a case having a deviation that is considered low in the art, for example, a deviation of 5% or less. In addition, when a certain parameter is referred to as being uniform in a given region, it may mean that it is uniform in terms of an average.

Throughout the specification, unless otherwise stated, each element may be singular or provided in plural.

When an arbitrary element is referred to as being disposed (or located or positioned) on the "above (or below)" or "on (or under)" a component, it may mean that the arbitrary element is placed in contact with the upper (or lower) surface of the component and may also mean that another component may be interposed between the component and any arbitrary element disposed (or located or positioned) on (or under) the component.

Throughout the specification, when "A and/or B" is stated, it means A, B or A and B, unless otherwise stated. That is, "and/or" includes any or all combinations of a plurality of items enumerated. When "C to D" is stated, it means C or more and D or less, unless otherwise specified.

Figure 2:
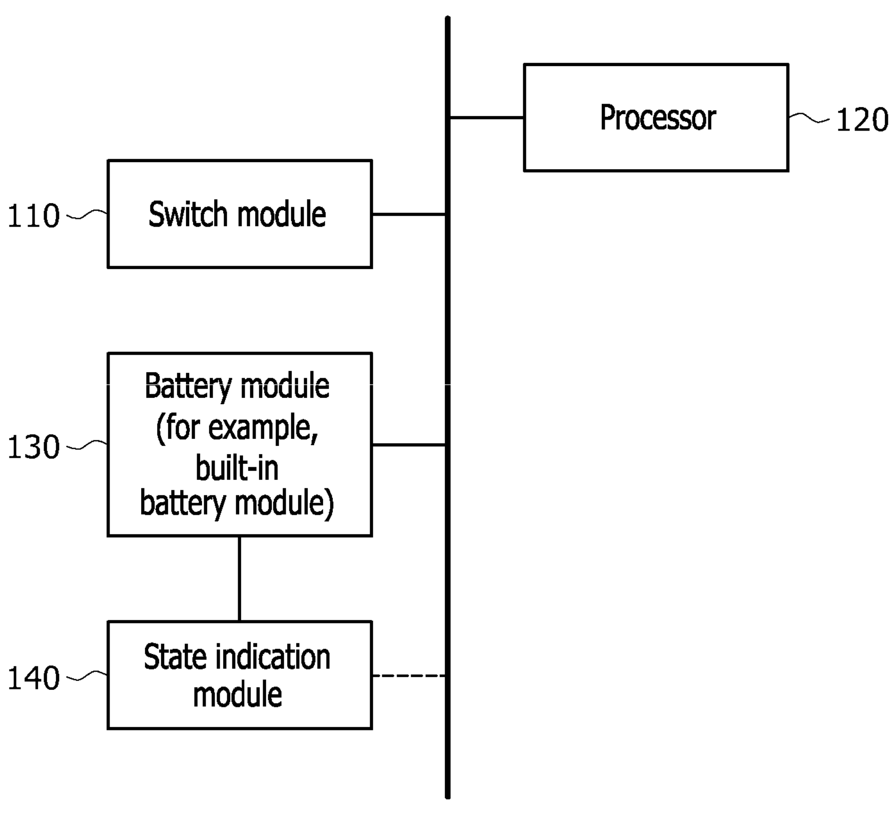
FIG. 2 is a schematic diagram of an apparatus for indicating a battery state according to some other embodiments of the present invention.

FIG. 1 is a schematic diagram of an apparatus for indicating a battery state according to some embodiments of the present invention, and FIG. 2 is a schematic diagram of an apparatus for indicating a battery state according to some other embodiments of the present invention.

Referring to FIG. 1 and FIG. 2, an apparatus for indicating a battery state according to the present invention includes a switch module 110, a processor 120, a battery module 130, and a state indication module 140.

The switch module 110 receives user manipulation input for terminating (or initiating) operation of an electronic appliance.

The switch module 110 may include a touch-type switch, a button-type switch, and a remote control-type switch.

The processor 120 determines whether user manipulation for terminating operation of the electronic appliance is input through the switch module 110.

Upon receipt of user manipulation input for terminating operation of the electronic appliance through the switch module 110, the processor 120 determines whether current operation of the electronic appliance is already completed or desired to be continued.

Upon determining that the current operation of the electronic appliance is already completed upon receipt of user manipulation input for terminating operation of the electronic appliance through the switch module 110, the processor 120 turns off the state indication module 140 and terminates discharge of the battery module 130 (that is, stops supply of power for driving the electronic appliance).

Here, terminating discharge from the battery module 130 (that is, terminating supply of power for driving the electronic appliance) means shutting off supply of power from the battery module 130 to a power module of the electronic appliance through a relay circuit (for example, a relay circuit including a relay, a switching element, such as a field effect transistor (FET), etc.).

Upon determining that the current operation of the electronic appliance is to be continued upon receipt of user manipulation input for terminating operation of the electronic appliance through the switch module 110, the processor 120 turns off the state indication module 140 and maintains discharge from the battery module 130 (that is, maintains supply of power for driving the electronic appliance) until the current operation of the electronic appliance is finished.

Figure 3:
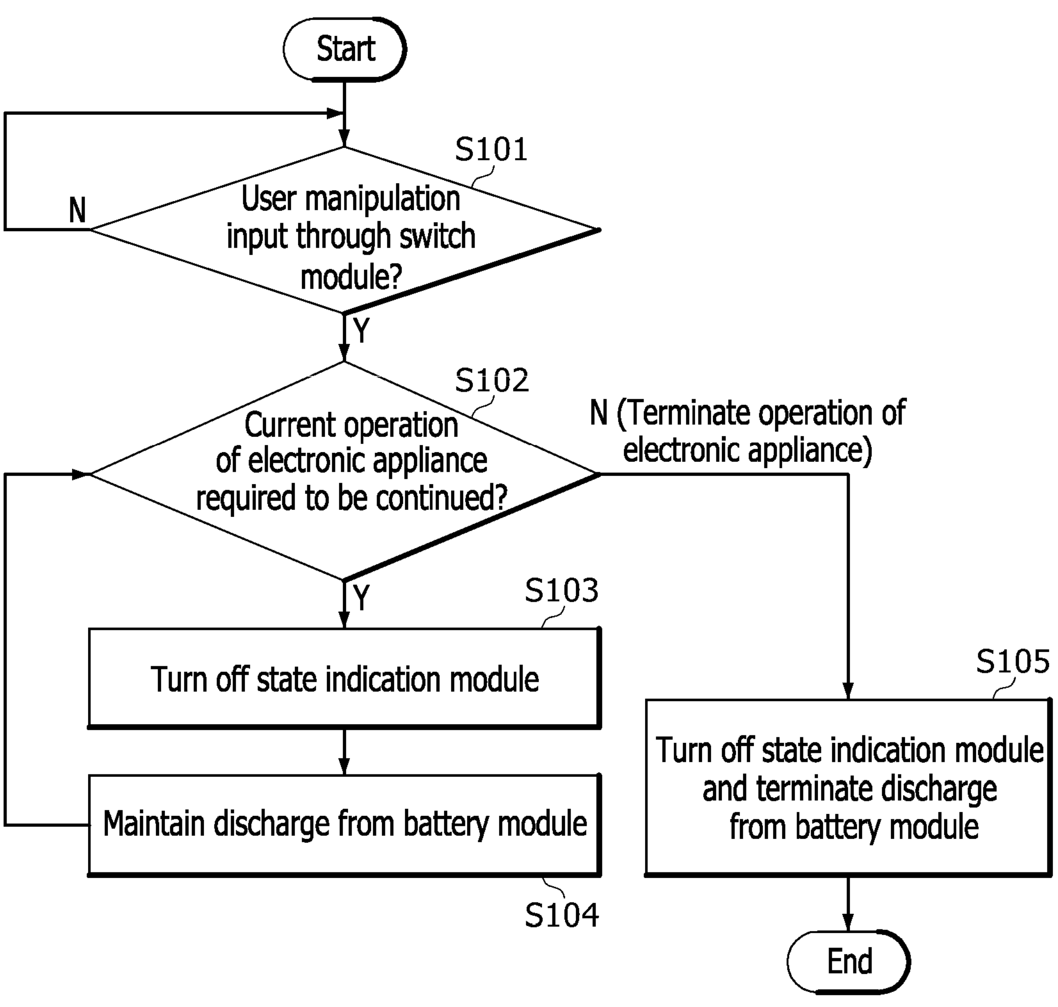
FIG. 3 is a flowchart illustrating a method of controlling an apparatus for indicating a battery state according to some embodiments of the present invention.

Here, when the battery module 130 is, for example, a built-in battery module as shown in FIG. 2, the processor 120 may directly perform OFF control of the state indication module 140 and discharge control from the battery module 130 (for example, control of the relay circuit) (see, e.g., FIG. 3).

In some examples, when the battery module 130 is an external battery module as shown in FIG. 2, a control circuit of the battery module 130 may perform OFF control of the state indication module 140 and discharge control from the battery module 130 in response to a control signal (for example, a state indication module OFF signal) transmitted from the processor 120 (see, e.g., FIG. 4).

Here, the control circuit of the battery module 130 may include a processor (or a microcomputer) or a logic gate.

The battery module 130 may be embedded in (or coupled to) the electronic appliance to supply power to the electronic device.

The battery module 130 may be a built-in battery module (see, e.g., FIG. 1), or may be an external battery module replaceable by a user (see, e.g., FIG. 2).

The battery module 130 and the processor 120 may communicate with each other (for example, may transmit/receive control signals or state signals to/from each other) in a wired manner via designated terminals.

The state indication module 140 may indicate an operating state of the electronic appliance. In addition, the state indication module 140 may indicate a state of the battery module 130.

The state indication module 140 performs state indication using a lighting element (for example, an LED).

The state indication module 140 may be mounted on at least one of the electronic appliance or the battery module 130. In some examples, a separate state indication module 140 may be mounted on the battery module 130, as shown in FIG. 2.

The state indication module 140 may indicate a state of a battery based on the colors of the lighting element (for example, an LED) and the On/OFF state of the lighting element (for example, an LED).

FIG. 3 is a flowchart illustrating a method of controlling the apparatus for indicating a battery state according to some embodiments of the present invention.

Referring to FIG. 3, upon receipt of user manipulation input for terminating operation of an electronic appliance through the switch module 110 (at S101), the processor 120 determines whether current operation of the electronic appliance is to be continued (S102).

Upon determining that the current operation of the electronic appliance is to be continued (at S102), the processor 120 turns off the state indication module 140 (S103) and maintains discharge from the battery module 130 (that is, maintains supply of power for driving the electronic device) until the current operation of the electronic appliance is finished (that is, while the current operation of the electronic appliance is continued) (S104).

Upon determining in step S102 that the current operation of the electronic appliance is already completed (at step S102), the processor 120 turns off the state indication module 140 and terminates discharge from the battery module 130 (that is, stops supply of power for driving the electronic appliance) (S105).

For example, the processor 120 may directly control switching of a relay circuit (for example, a relay circuit including a relay, a switching element (for example, a FET), etc.) to shut off supply of power from the battery module 130 to a power module of the electronic appliance so as to terminate discharge from the battery module 130.

FIG. 4 is a flowchart illustrating a method of controlling the apparatus for indicating a battery state according to some other embodiments of the present invention.

Referring to FIG. 4, upon receipt of user manipulation input for terminating operation of an electronic appliance through the switch module 110 (at S201), the processor 120 determines whether current operation of the electronic appliance is to be continued (S202).

Upon determining in step S202 that the current operation of the electronic appliance is already completed (at S202), the processor 120 turns off the state indication module 140 and terminates discharge from the battery module 130 (that is, stops supply of power for driving the electronic appliance) (S205).

Upon determining in step S202 that the current operation of the electronic appliance is required to be continued (at S202), the processor 120 outputs a predetermined control signal (for example, a state indication module OFF signal) to the battery module 130 periodically (for example, at time intervals of 1 second) until the current operation of the electronic appliance is finished (that is, while the current operation of the electronic appliance is continued) (S203).

In order to output the predetermined control signal (for example, a state indication module OFF signal) to the battery module 130 periodically (for example, at time intervals of 1 second), the processor 120 is operated on a first timer set to a predetermined time value (for example, 1 second) (S204).

When the battery module 130 receives the predetermined control signal (for example, a state indication module OFF signal) from the processor 120 before expiration of a time (for example, 3 seconds) set on a second timer (at S205), a control circuit of the battery module 130 resets the second timer (S206), turns off the state indication module 140 (S207), and maintains discharge from the battery module 130 (that is, maintains supply of power for driving the electronic appliance) (S208).

Conversely, when the battery module 130 does not receive the predetermined control signal (for example, a state indication module OFF signal) from the processor 120 before expiration of the time (for example, 3 seconds) set on the second timer (that is, when the battery module 130 receives the predetermined control signal after expiration of the time set on the second timer) (at S205), the control circuit of the battery module 130 turns off the state indication module 140 and terminates discharge from the battery module 130 (that is, stops supply of power for driving the electronic appliance) (S209).

As described above, the apparatus for indicating a battery state according to the present invention can indicate a state of a battery supplying power to an electronic appliance. In addition, when applied to an electronic appliance equipped with a state indication module implemented simply by a lighting element (for example, an LED), the apparatus for indicating a battery state according to the present invention can prevent a user from making an incorrect determination that the electronic appliance or the battery module has malfunctioned when there occurs a situation in which current operation of the electronic appliance is to be continued without being immediately terminated after the user manipulates the electronic appliance to terminate operation of the electronic appliance.

The embodiments described herein may be implemented, for example, as a method or process, a device, a software program, a data stream, or a signal. Although discussed in the context of a single type of implementation (for example, discussed only as a method), features discussed herein may also be implemented in other forms (for example, a device or a program). The device may be implemented by suitable hardware, software, firmware, and the like. The method may be implemented on a device, such as a processor that generally refers to a processing device including a computer, a microprocessor, an integrated circuit, a programmable logic device, etc. The processor includes a communication device such as a computer, a cell phone, a personal digital assistant (PDA), and other devices that facilitate communication of information between the device and end-users.

The processor may be implemented as a central processing unit (CPU) or a system on chip (SoC), may run an operating system or an application to control a plurality of hardware or software components connected to the processor, and may perform various data processing and computation tasks. The processor may be configured to execute at least one instruction stored in a memory and store data resulting from execution thereof in the memory.

Although the present invention has been described with reference to embodiments and drawings illustrating aspects thereof, the present invention is not limited thereto. Various suitable modifications and variations can be made by a person skilled in the art to which the invention belongs within the scope of the technical spirit of the invention, as defined by the claims and equivalents thereof.

What is claimed is:

1. An apparatus for indicating a battery state, the apparatus comprising:

a battery module configured to supply power to an electronic appliance;

a switch module configured to receive user manipulation input for terminating operation of the electronic appliance; and a processor being configured to receive user manipulation input for terminating operation of the electronic appliance through the switch module, to determine whether a current operation of the electronic appliance is to be continued, and, in response to receiving the user manipulation input and determining that the current operation of the electronic appliance is to be continued, to turn off a state indication module indicating a state of a battery and to maintain discharge from the battery module until current operation of the electronic appliance is finished, wherein the battery module is configured to perform OFF control of the state indication module and discharge control from the battery module in response to a control signal transmitted from the processor, the control signal being a state indication module OFF signal.

2. The apparatus according to claim 1, wherein, in response to receiving the user manipulation input for terminating operation of the electronic appliance and determining that the current operation of the electronic appliance is already completed, the processor is configured to turn off the state indication module and terminate discharge from the battery module.

3. The apparatus according to claim 1, wherein the battery module comprises a built-in battery module.

4. The apparatus according to claim 1, wherein the processor is configured to terminate or maintain discharge from the battery module.

5. The apparatus according to claim 1, wherein the state indication module is configured to indicate the state of the battery using a light emitting diode (LED).

6. A method of indicating a battery state, the method comprising:

receiving, by a processor of an apparatus for indicating a battery state, user manipulation input for terminating an electronic appliance through a switch module;

determining, by the processor, that a current operation of the electronic appliance is to be continued;

turning off, by the processor, a state indication module configured to indicate a state of a battery; and maintaining, by the processor, discharge from a battery module supplying power to the electronic appliance until current operation of the electronic appliance is finished, wherein the battery module is configured to perform OFF control of the state indication module and discharge control from the battery module in response to a control signal transmitted from the processor, the control signal being a state indication module OFF signal.

7. The method according to claim 6, further comprising:

determining, by the processor, that the current operation of the electronic appliance is already completed; and turning off, by the processor, the state indication module and terminating discharge from the battery module.

8. The method according to claim 6, wherein, in response to performing discharge control from the battery module, the processor is configured to terminate or maintain discharge from the battery module.

* * * * *